(12) United States Patent
Wang et al.

(10) Patent No.: US 10,038,120 B2
(45) Date of Patent: Jul. 31, 2018

(54) LIGHT EMITTING DIODE

(71) Applicant: XIAMEN SANAN OPTOELECTRONICS TECHNOLOGY CO., LTD., Xiamen (CN)

(72) Inventors: Jin Wang, Tianjin (CN); Yi-an Lu, Tianjin (CN); Chun-Yi Wu, Tianjin (CN); Ching-Shan Tao, Tianjin (CN); Duxiang Wang, Tianjin (CN)

(73) Assignee: XIAMEN SANAN OPTOELECTRONICS TECHNOLOGY CO., LTD., Xiamen (CN)

( * ) Notice: Subject to any disclaimer, the term of this patent is extended or adjusted under 35 U.S.C. 154(b) by 267 days.

(21) Appl. No.: 15/384,221

(22) Filed: Dec. 19, 2016

(65) Prior Publication Data

US 2017/0098738 A1   Apr. 6, 2017

Related U.S. Application Data

(63) Continuation of application No. PCT/CN2015/073469, filed on Mar. 2, 2015.

(30) Foreign Application Priority Data

Jul. 1, 2014   (CN) .......................... 2014 1 0308320

(51) Int. Cl.
*H01L 33/38* (2010.01)
*H01L 33/14* (2010.01)
*H01L 33/62* (2010.01)

(52) U.S. Cl.
CPC ............ *H01L 33/38* (2013.01); *H01L 33/145* (2013.01); *H01L 33/62* (2013.01)

(58) Field of Classification Search
CPC . H01L 27/288; H01L 31/143; H01L 51/0032; H01L 33/38; H01L 33/62
See application file for complete search history.

(56) References Cited

U.S. PATENT DOCUMENTS

2011/0210310 A1* 9/2011 Kamiya .................. H01L 33/40
                                                                                     257/13

* cited by examiner

*Primary Examiner* — Elias M Ullah
(74) *Attorney, Agent, or Firm* — Syncoda LLC; Feng Ma; Junjie Feng

(57) ABSTRACT

A light emitting diode includes: a substrate; a semiconductor light emitting laminate on the substrate, including from bottom up a first semiconductor layer, an active layer, and a second semiconductor layer electrically dissimilar to the first semiconductor layer; a transparent conductive layer with an opening portion; the first electrode electrically connected with the first semiconductor layer; and the second electrode electrically connected with the second semiconductor layer; the second electrode fills the opening portion, and the position where the second electrode contacts the transparent conductive layer is arranged with a recessed portion, and the second electrode is embedded in the transparent conductive layer. The recessed portion is formed on the second electrode, having the second electrode embedded in the transparent conductive layer, increasing the counter force of the second electrode against the horizontal thrust during encapsulation of the LED structure and avoiding detachment during wire bonding for encapsulation.

20 Claims, 6 Drawing Sheets

LIGHT EMITTING DIODE

The present application is a continuation of, and claims priority to, PCT/CN2015/073469 filed on Mar. 2, 2015, which claims priority to Chinese Patent Application No. 201410308320.3 filed on Jul. 1, 2014. The disclosures of these applications are hereby incorporated by reference in their entirety.

BACKGROUND

The light emitting diode ("LED" for short) has been applied in various fields due to its long service life and low energy consumption etc., and especially with the increasingly significant improvement of illumination performance index, the light emitting diode is applied more and more extensively in such areas as optical display device, traffic signs, data storage device, communication device and lighting device.

Presently, the large-sized light emitting diodes have been applied more and more extensively, and with the increase of area, the size of electrode is also increasing, resulting in the more severe light shielding or light absorption by the electrode and the decreased light transmission, and finally decreased light emitting efficiency. An effective solution to the problem is that: an electric insulating layer is added under the electrode, forming a high reflection omnibearing reflecting mirror structure so as to reduce the light shielding or light absorption by the electrode. Yet the flat upper and lower surfaces of the electrode are easy to cause the detachment of welded metal ball or electrode during wire bonding for encapsulation

SUMMARY

A light emitting diode is provided that can increase the adhesion between the electrode and the epitaxial laminate and thus to avoid detachment.

A light emitting diode, comprising: a substrate; a semiconductor light emitting laminate on the substrate, comprising from bottom upwards the first semiconductor layer, an active layer, and the second semiconductor layer which is electrically dissimilar to the first semiconductor layer; a transparent conductive layer on the semiconductor light emitting laminate, with an opening part; the first electrode electrically connected with the first semiconductor layer; and the second electrode electrically connected with the second semiconductor layer; the second electrode fills the opening part, and the position where the second electrode contacts the transparent conductive layer is arranged with a groove portion, and the second electrode is embedded in the transparent conductive layer, increasing the adhesion of the electrode.

In some embodiments, the opening part is in a taper shape, narrow at top and wide at bottom, and the second electrode fills the opening part, higher than the upper surface of the transparent conductive layer.

In some embodiments, the opening part of the transparent conductive layer is divided into two parts, the upper part and the lower part, the bore of both the upper part and lower part is fixed.

In some embodiments, the opening part of the transparent conductive layer is divided into two parts, the upper part and the lower part, the bore of the upper part is fixed while that of the lower part is decreased from bottom upwards.

In some embodiments, the area of the part of the second electrode higher than the upper surface of the transparent conductive layer is larger than that of the lower opening part of the opening part.

In some embodiments, the part of the second electrode located at the opening part is in a taper shape.

In some embodiments, the part of the second electrode located at the opening part has a tilted side surface.

In some embodiments, the second electrode is divided into an upper main body portion, a middle main body portion and a lower main body portion, and the upper main body portion is higher than the upper surface of the transparent conductive layer, the middle main body portion and the lower main body portion are located in the opening part, the middle main body portion has a smallest cross section and a fixed area, and the area of the cross section of the lower main body portion decreases from bottom upwards.

In some embodiments, the second electrode is divided into an upper main body portion, a middle main body portion and a lower main body portion, and the upper main body portion is higher than the upper surface of the transparent conductive layer, the middle main body portion and the lower main body portion are located in the opening part, the middle main body portion has a smallest cross section and a fixed area, and the area of the cross section of the lower main body portion is fixed.

In some embodiments, there are grooves on the upper surface of the second electrode.

In some embodiments, a current blocking layer is arranged under the second electrode.

In another aspect, a light-emitting system is provided including a plurality of the light-emitting diodes disclosed herein. The light-emitting system can be a display, a lighting system, a signage, etc.

According to some embodiments, advantageously, the groove portion is formed on the second electrode, having the second electrode embedded in the transparent conductive layer, increasing the counter force of the second electrode against the horizontal thrust during the encapsulation of the light emitting diode structure and avoiding detachment during wire bonding for encapsulation.

BRIEF DESCRIPTION OF THE DRAWINGS

Other characteristics and effects of various embodiments are presented in the following embodiments with reference to the drawings, among which.

The numbers in drawings indicate the following components:

10: substrate; 21: first semiconductor layer; 22: active layer; 23: second semiconductor layer; 30: current blocking layer; 40: transparent conductive layer; 40a: upper surface of the transparent conductive layer; 40b: lower surface of the transparent conductive layer; 50: second electrode; 50a: lower surface of the second electrode; 50b: upper surface of the second electrode; 51: upper main body portion of the second electrode; 52: middle main body portion of the second electrode; 53: lower main body portion of the second electrode; 54: groove portion of the second electrode; 60: first electrode; 70: opening part; 71: upper opening part; 72: lower opening part; 80: grooves.

DETAILED DESCRIPTION

Before the detailed description of the invention, it should be noted that similar components are presented by the same number in the description below.

Figure 1:
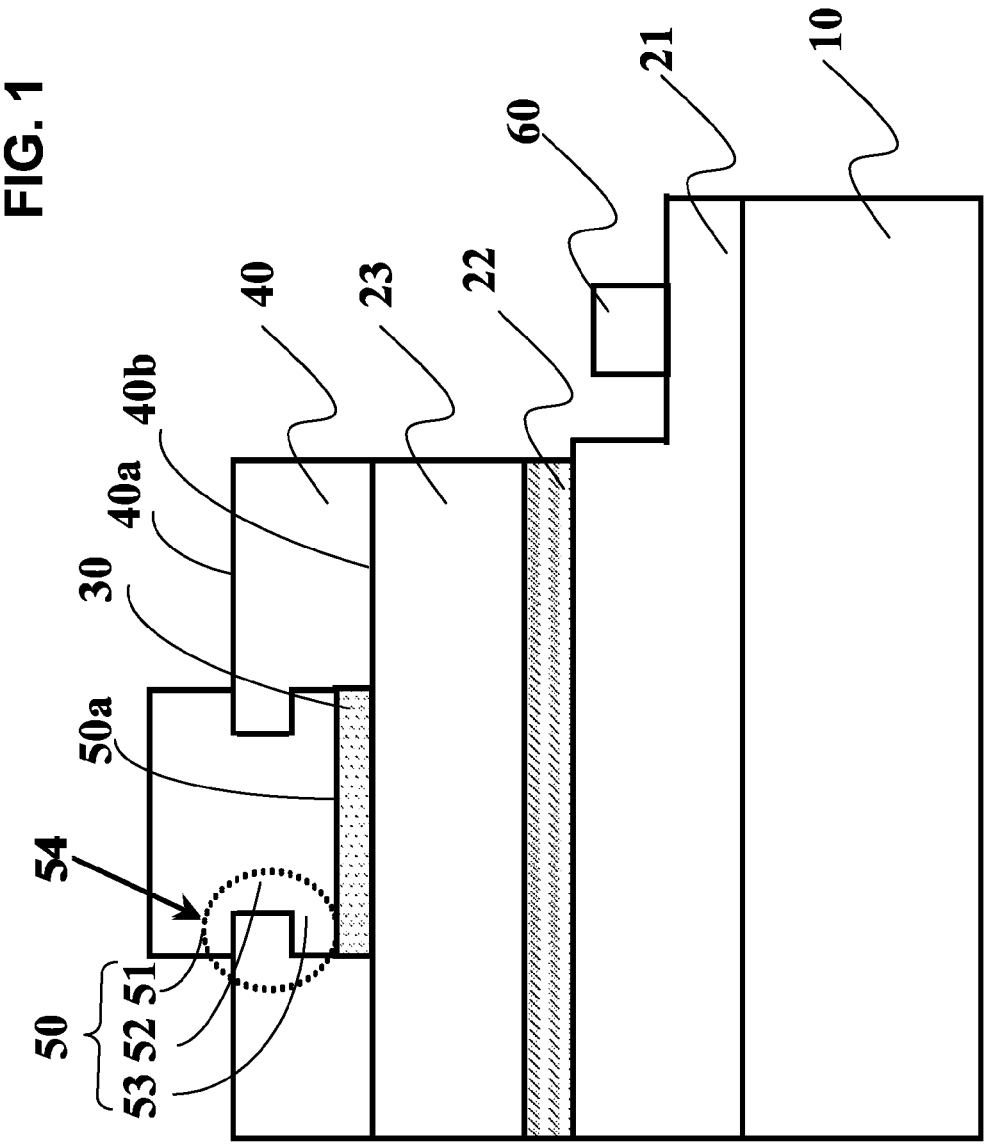
FIG. 1 is a sectional view of the light emitting diode of Embodiment 1.

FIG. 1 shows a cross-sectional structural view of the light emitting diode of Embodiment 1 of the present disclosure, comprising a substrate 10 and a semiconductor light emitting laminate 10 located on the substrate. The materials of the substrate 10 include, but are not limited to insulating materials, e.g., silicone rubber, glass, quartz, ceramics or aluminum nitride. The semiconductor light emitting laminate comprise the first semiconductor layer 21, an active layer 22, and the second semiconductor layer 23, when the first semiconductor layer 21 is a p-type semiconductor, the second semiconductor layer 23 may be an electrically dissimilar n-type semiconductor, when the first semiconductor layer 21 is an n-type semiconductor, the second semiconductor layer 23 may be an electrically dissimilar p-type semiconductor. The active layer 22 is located between the first semiconductor layer 21 and the second semiconductor layer 23 and is a neutral, n-type or p-type electric semiconductor. Subjected to electric current passing through the semiconductor light emitting laminate, the active layer 22 is stimulated to emit a light. When the active layer 22 is made of nitride-based material, the active layer 22 emits blue or green light; when AlGaInP-based material is selected, the active layer 22 emits light in red, orange and yellow colors belonging to amber color system.

Figure 2:
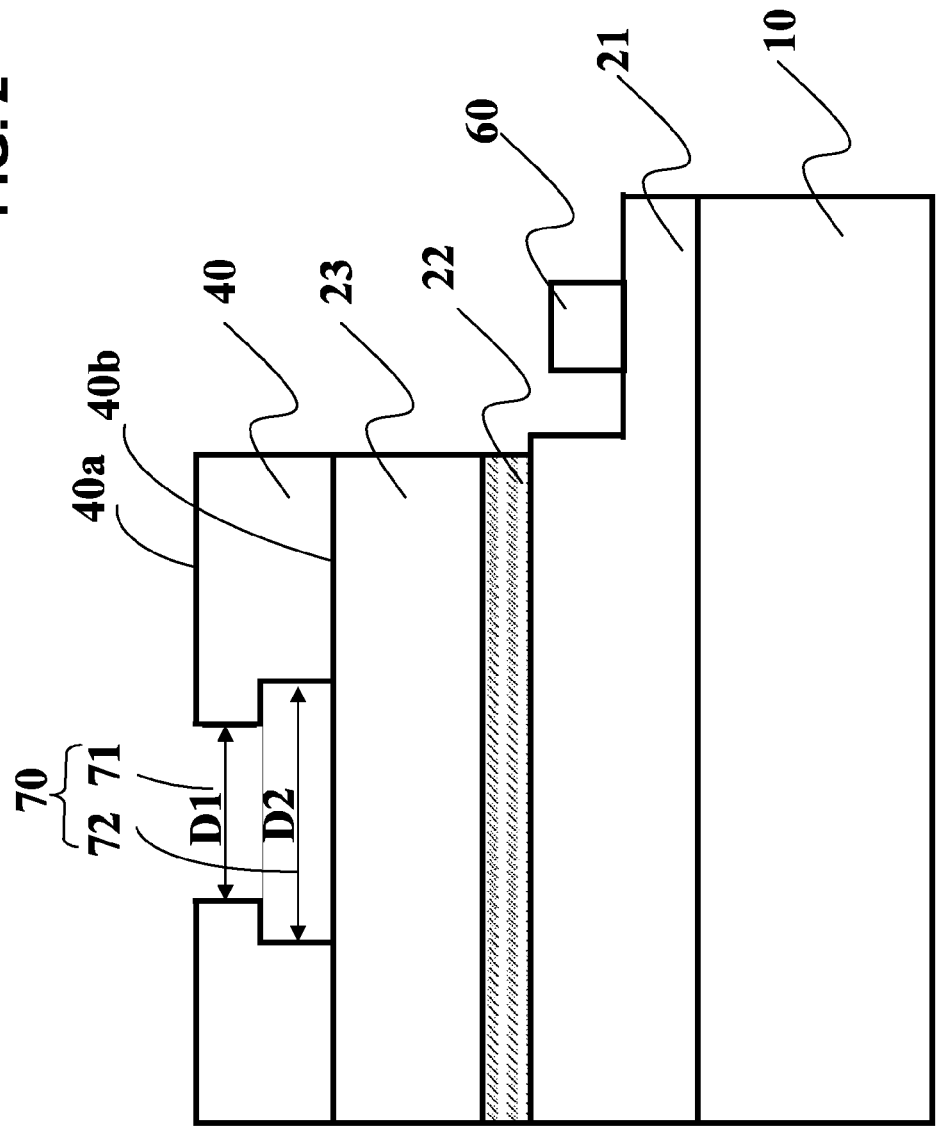
FIG. 2 is another sectional view of the light emitting diode of Embodiment 1.

A transparent conductive layer 40 is arranged on the semiconductor light emitting laminate, with an opening part 70 in a taper shape, narrow at the top and wide at the bottom. As shown in FIG. 2, the opening part 70 is divided into an upper opening part 71 and a lower opening part 72 which are coaxial, the diameter D1 of the upper opening part 71 is 30-100 μm and the diameter D2 of the lower opening part 72 is 50-150 μm, and D1 and D2 in the present embodiment are 50 μm and 90 μm, respectively.

The second electrode 50 is arranged on the transparent conductive layer 40 and filling the opening part 70, forming an ohmic contact with the transparent conductive layer 40. The second electrode 50 is electrically connected with the second semiconductor layer 23 through the transparent conductive layer 40, and when current is applied from the second electrode 50, the transparent conductive layer 40 helps increase the uniformity of the current spreading, thus avoiding excessive concentration of current in partial region of the second semiconductor layer 23. The first electrode 60 is arranged on the first semiconductor layer 21, and has an ohmic contact with the first semiconductor layer 21.

The second electrode 50 substantially fills the opening part 70 of the transparent conductive layer 40, and is divided into an upper main body portion 51, a middle main body portion 52 and a lower main body portion 53, and the upper main body portion is the portion higher than the upper surface 40a of the transparent conductive layer 40, the cross-sectional area of the upper main body portion is larger than the area of the upper opening part 71 of the opening part 71, the middle main body portion 52 is located in the upper opening part 71 of the opening part 70 and is in a cylindrical shape, and the lower main body portion 53 is located in the lower opening part 72 of the opening part 70 and is in a cylindrical shape. In the second electrode 50 structure, the middle main body portion 71 has the smallest cross section, so that a groove 54 is formed at the middle main body portion, having the second electrode 50 embedded in the transparent conductive layer 40, increasing the counter force of the second electrode against the horizontal thrust during the encapsulation of the light emitting diode structure and avoiding detachment during wire bonding for encapsulation.

The second electrode 50 can be a multilayer structure, for example, including a welding pad layer and a high reflection layer (not marked in the drawing), and the welding pad layer is for connecting operation in wire bonding and guide external current to enter the semiconductor light emitting laminate, and includes a single or multiple layer metal structure made of Ni, Ti, Al, Au. The high reflection layer is located under the welding pad layer and has ohmic contact with the transparent conductive layer, including but not limited to the single or multiple layer metal structure made of metal with good electric conductivity and the reflectivity of visible light waveband higher than 70%, such as Al, Au, Pt, Ag, Rh and the alloy of those metals.

A current blocking layer 30 is located between the second semiconductor layer 23 and the second electrode 50, having a high resistance so as to block the current to flow directly through the lower surface 50a of the second electrode, lower luminescence quantity right under the second electrode and finally reduce the light absorbed by the lower surface 50a of the second electrode, and the materials of the current blocking layer 30 include, but are not limited to organic materials, such as Sub, benzocyclobutene (BCB), perfluoro cyclobutane (PFCB), epoxy resin, acrylic resin, cyclic olefin copolymer (COC), polymethyl methacrylate (PMMA), polyethylene terephthalate (PET), polycarbonate (PC), polyether imide and fluorocarbon polymer, inorganic materials, such as silicone and glass, dielectric material, such as alumina ($Al_2O_3$), silicon nitride (SiNx), silicon oxide ($SiO_2$) and titanium oxide ($TiO_2$), or the combination of the above materials.

In this embodiment, an electric insulating layer is added below the electrode, forming a high reflection omnibearing reflecting mirror structure so to reduce light shielding or light absorption by the electrode. Further, by patterning the electrode, a groove 54 is formed on the second electrode to have the second electrode 50 embedded in the transparent conductive layer 40, thus increasing the counter force of the second electrode against the horizontal thrust during the encapsulation of the light emitting diode structure and avoiding detachment during wire bonding for encapsulation.

Figure 3:
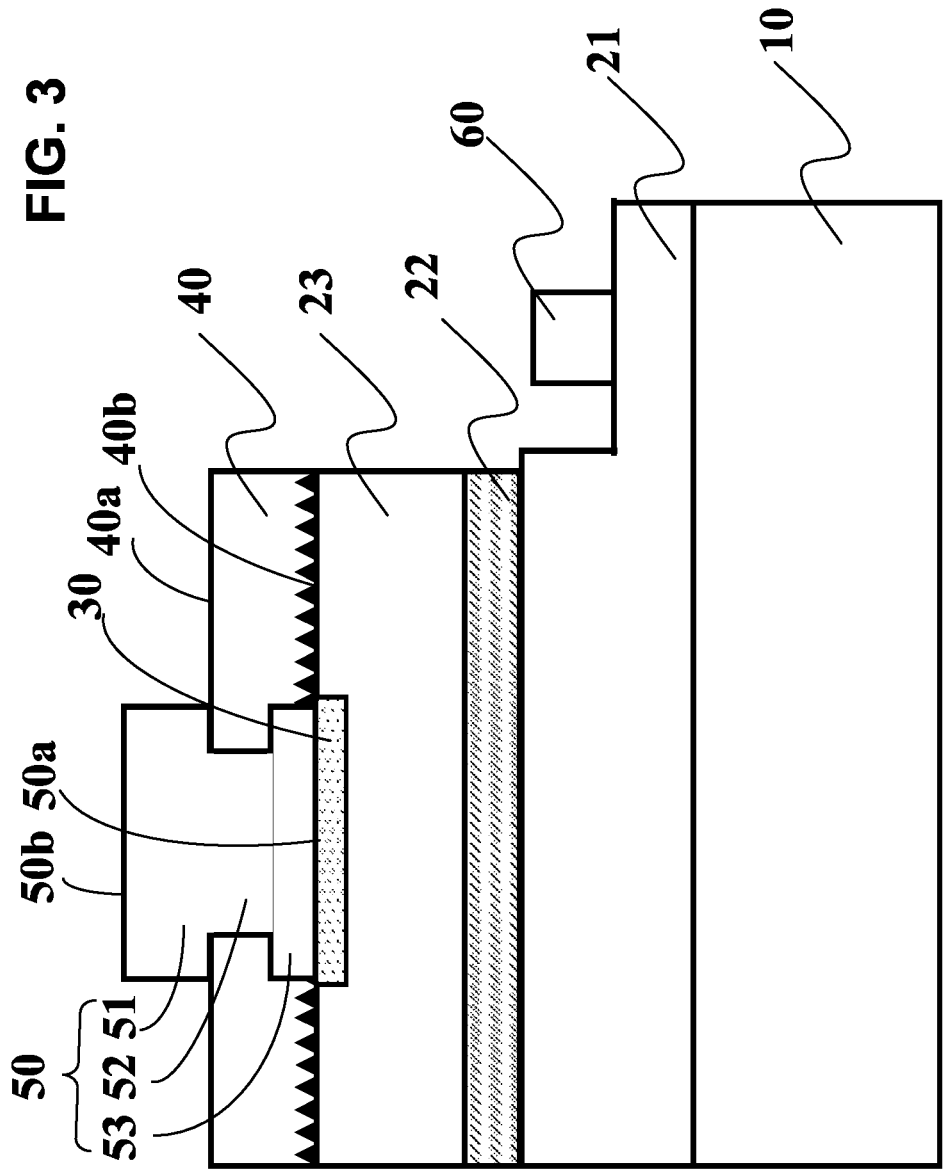
FIG. 3 is a sectional view of the light emitting diode of Embodiment 2.

FIG. 3 shows a cross-sectional structural view of the light emitting diode of Embodiment 2 of the present disclosure, and the difference between Embodiment 2 and Embodiment 1 is that the current blocking layer 30 is located on the surface of the second semiconductor layer 23, and that the upper surface of the current blocking layer flushes with the second semiconductor layer and forms a rough structure on the surface of the second semiconductor layer 23. A high resistance area with a thickness of 10-100 nm is formed by implanting ions by ion injection method or by ICP dry etching through the second semiconductor layer under the second electrode. Before the forming of the transparent conductive layer 40, chemical etching or dry etching can be employed to etch part of the upper surface of the second semiconductor layer 23 to form a rough surface. In this present embodiment, the current blocking layer 30 is implanted into the surface of the second semiconductor layer 23 to reduce the thickness of the transparent conductive layer 40 and form the rough surface on the second semiconductor layer 23 and finally improve external light extraction efficiency of the light emitting diode.

Figure 4:
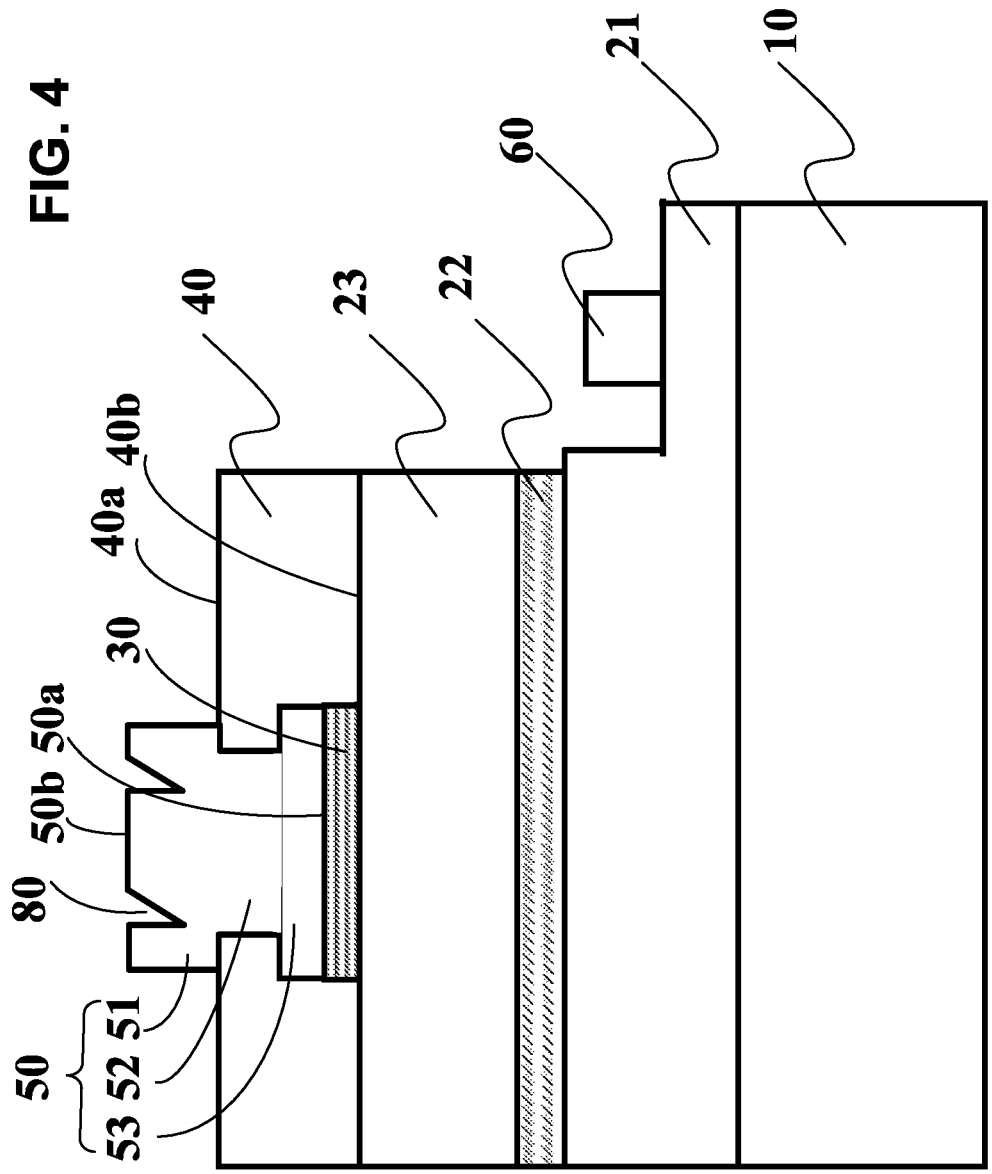
FIG. 4 is a sectional view of the light emitting diode of Embodiment 3.

FIG. 4 shows a cross-sectional structural view of the light emitting diode of Embodiment 3 of the present disclosure, and the difference between Embodiment 3 and Embodiment 1 is that the groove 80 is formed on the upper surface 50b of the second electrode 50, increasing the contact area of welded metal ball for wire bonding and the second electrode and further the adhesion. The groove 80 is in a ring shape, with an area accounting for 1/5 to 1/3 of the upper surface 50b of the second electrode 50 and the depth preferably not more than the upper main body portion 50a of the second electrode 50.

Figure 5:
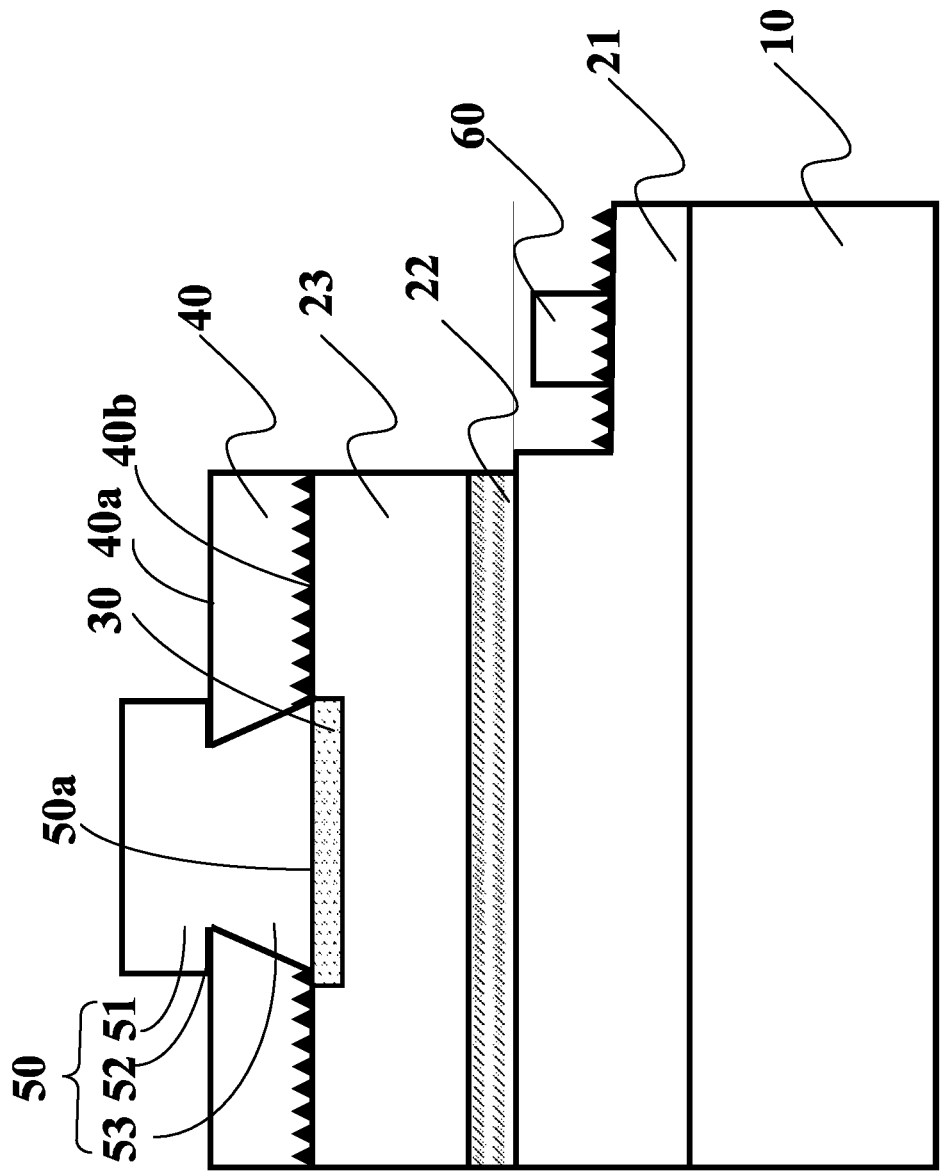
FIG. 5 is a sectional view of the light emitting diode of Embodiment 4.

FIG. 5 shows a cross-sectional structural view of the light emitting diode of Embodiment 4 of the present disclosure, and the difference between Embodiment 4 and Embodiment 1 is that: the opening part 70 of the transparent conductive layer 40 has a tilted side wall, the part of the second electrode 50 in the transparent conductive layer 40 has a tilted side, the current blocking layer 30 is on the surface of the second semiconductor layer 23, with the upper surface of the current blocking layer 30 flushes with the second semiconductor layer 23, and a rough structure is formed on the surface of the second semiconductor layer 23 and part of the surface of the first semiconductor layer 21. The tilt of the side wall of the opening part 70 of the transparent conductive layer 40 is 80-40°, preferably 50-60°. A high resistance area with a thickness of 10-100 nm is formed by implanting ions by ion injection method or by ICP dry etching through the second semiconductor layer 23 under the second electrode 50. Before the forming of the transparent conductive layer 40, chemical etching or dry etching can be employed to etch part of the first semiconductor layer 21 and the upper surface of the second semiconductor layer 23 to form a rough surface. In this embodiment, the opening part is designed to be a tilted taper, the current blocking layer is designed on the surface of the second semiconductor layer 23 to guarantee that a groove is formed at the location where the second electrode contacts the upper surface of the transparent conductive layer while reducing the thickness of the transparent conductive layer as much as possible, and a rough surface formed on part of the upper surface of the first semiconductor layer 21 and the second semiconductor layer 22 improves the external light extraction efficiency of the light emitting efficiency.

Figure 6:
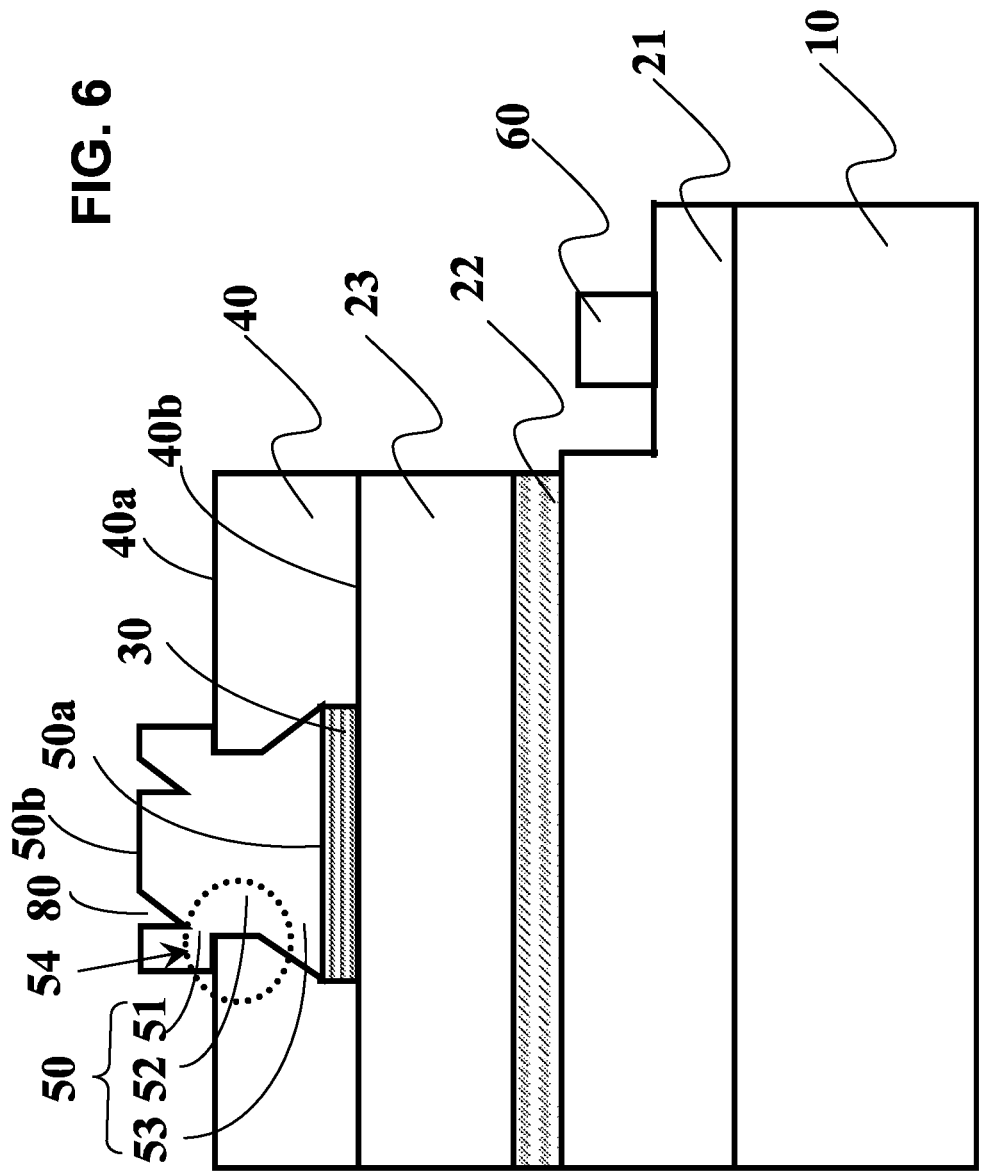
FIG. 6 is a sectional view of the light emitting diode of Embodiment 5 of the disclosure.

FIG. 6 shows a cross-sectional structural view of the light emitting diode of Embodiment 5 of the present disclosure, and the difference between Embodiment 5 and Embodiment 1 is that: the opening part 70 of the transparent conductive layer 40 is divided into an upper portion 71 and lower portion 72, the diameter D1 of the upper portion is fixed, while the diameter D2 of the lower portion decreases from bottom upwards, the second electrode 50 completely fills the opening part 70, and the upper main body portion 51 and the middle main body portion 52 of the second electrode 50 are in cylindered shape, and the lower main body portion 53 is a taper, and a groove 80 is arranged on the upper surface 50b, thus increasing the contact area between welded metal ball and the second electrode and then the adhesion.

As shown in FIG. 6, the second electrode has a groove 54 to cause the second electrode 50 embedded in the transparent conductive layer 40, thus increasing the counter force of the second electrode against the horizontal thrust during the encapsulation of the light emitting diode structure; the lower main body portion 53 of the second electrode has a tilted side, increasing the counter force of the second electrode against the vertical pull; the upper surface 50b of the second electrode has a recessed structure, increasing the contact area between the welded metal ball and the electrode and further the adhesion and avoiding detachment during wire bonding for encapsulation.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A light emitting diode, comprising:
   a substrate;
   a semiconductor light emitting laminate over said substrate, comprising from bottom up a first semiconductor layer, an active layer, and a second semiconductor layer that is electrically dissimilar to the first semiconductor layer;
   a transparent conductive layer on said semiconductor light emitting laminate, with an opening portion;
   the first electrode electrically connected with the first semiconductor layer; and
   the second electrode electrically connected with the second semiconductor layer;
   said second electrode fills the opening portion, and the position where the second electrode contacts said transparent conductive layer is arranged with a recessed portion, and the second electrode is embedded in said transparent conductive layer.

2. The light emitting diode of claim 1, wherein: said opening portion is in a taper shape, narrow at top and wide at bottom, and said second electrode fills said opening portion, higher than the upper surface of said transparent conductive layer.

3. The light emitting diode of claim 2, wherein: the opening portion of said transparent conductive layer is divided into two portions including an upper portion and a lower portion, an aperture of the upper portion and an aperture of the lower portion is fixed.

4. The light emitting diode of claim 2, wherein: the opening portion of said transparent conductive layer is divided into two portions including an upper portion and a lower portion, an aperture of the upper portion is fixed while an aperture of the lower portion decreases from bottom up.

5. The light emitting diode of claim 1, wherein: the area of the portion of said second electrode higher than the upper surface of said transparent conductive layer is larger than that of the upper opening portion of said opening portion.

6. The light emitting diode of claim 1, wherein: the portion of said second electrode located at said opening portion is in a taper shape.

7. The light emitting diode of claim 6, wherein: said second electrode is divided into an upper main body portion, a middle main body portion and a lower main body portion, and the upper main body portion is higher than the upper surface of said transparent conductive layer, the middle main body portion and the lower main body portion are located in said opening portion, said middle main body portion has a smallest cross section and a fixed area, and the area of the cross section of said lower main body portion is fixed.

8. The light emitting diode of claim 1, wherein: the portion of said second electrode located at said opening portion has a tilted side surface.

9. The light emitting diode of claim 8, wherein: said second electrode is divided into an upper main body portion, a middle main body portion and a lower main body portion, and the upper main body portion is higher than the upper surface of said transparent conductive layer, the middle main body portion and the lower main body portion are located in said opening portion, said middle main body portion has a smallest cross section and a fixed area, and the area of the cross section of said lower main body portion decreases from bottom upwards.

10. The light emitting diode of claim 1, wherein: the upper surface of said second electrode has a groove.

11. The light emitting diode of claim 1, wherein: a current blocking layer is arranged under said second electrode.

12. A light-emitting system comprising a plurality of light emitting diodes, each light emitting diode including:
a substrate;
a semiconductor light emitting laminate over said substrate, comprising from bottom up a first semiconductor layer, an active layer, and a second semiconductor layer that is electrically dissimilar to the first semiconductor layer;
a transparent conductive layer on said semiconductor light emitting laminate, with an opening portion;
the first electrode electrically connected with the first semiconductor layer; and
the second electrode electrically connected with the second semiconductor layer;
said second electrode fills the opening portion, and the position where the second electrode contacts said transparent conductive layer is arranged with a recessed portion, and the second electrode is embedded in said transparent conductive layer.

13. The light-emitting system of claim 12, wherein: said opening portion is in a taper shape, narrow at top and wide at bottom, and said second electrode fills said opening portion, higher than the upper surface of said transparent conductive layer.

14. The light-emitting system of claim 13, wherein: the opening portion of said transparent conductive layer is divided into two portions, the upper portion and the lower portion, the bore of both the upper portion and lower portion is fixed.

15. The light-emitting system of claim 13, wherein: the opening portion of said transparent conductive layer is divided into two portions, the upper portion and the lower portion, the bore of the upper portion is fixed while that of the lower portion is decreased from bottom upwards.

16. The light-emitting system of claim 12, wherein: the area of the portion of said second electrode higher than the upper surface of said transparent conductive layer is larger than that of the upper opening portion of said opening portion.

17. The light-emitting system of claim 12, wherein: the portion of said second electrode located at said opening portion is in a taper shape.

18. The light-emitting system of claim 17, wherein: said second electrode is divided into an upper main body portion, a middle main body portion and a lower main body portion, and the upper main body portion is higher than the upper surface of said transparent conductive layer, the middle main body portion and the lower main body portion are located in said opening portion, said middle main body portion has a smallest cross section and a fixed area, and the area of the cross section of said lower main body portion is fixed.

19. The light-emitting system of claim 12, wherein: the portion of said second electrode located at said opening portion has a tilted side surface.

20. The light-emitting system of claim 19, wherein: said second electrode is divided into an upper main body portion, a middle main body portion and a lower main body portion, and the upper main body portion is higher than the upper surface of said transparent conductive layer, the middle main body portion and the lower main body portion are located in said opening portion, said middle main body portion has a smallest cross section and a fixed area, and the area of the cross section of said lower main body portion decreases from bottom upwards.

* * * * *